United States Patent [19]
Thomas

[11] Patent Number: 6,017,585
[45] Date of Patent: Jan. 25, 2000

[54] HIGH EFFICIENCY SEMICONDUCTOR WAFER COATING APPARATUS AND METHOD

[75] Inventor: Michael E. Thomas, Milpitas, Calif.

[73] Assignee: National Semiconductor Corporation, Santa Clara, Calif.

[21] Appl. No.: 09/028,301

[22] Filed: Feb. 24, 1998

[51] Int. Cl.$^7$ .............................. B05D 3/12; B05C 11/02
[52] U.S. Cl. .................. 427/240; 427/10; 427/385.5; 118/52; 118/713; 437/231
[58] Field of Search ................. 427/240, 385.5, 427/10; 118/52, 713; 437/231

[56] References Cited

U.S. PATENT DOCUMENTS

| | | | |
|---|---|---|---|
| 4,180,604 | 12/1979 | Feng et al. | 430/270 |
| 4,230,793 | 10/1980 | Losert et al. | 430/315 |
| 4,246,335 | 1/1981 | Keogh et al. | 430/278 |
| 4,260,675 | 4/1981 | Sullivan | 430/315 |
| 4,320,191 | 3/1982 | Yoshikawa et al. | 430/296 |
| 4,410,558 | 10/1983 | Izu et al. | 427/39 |
| 4,431,723 | 2/1984 | Proskow | 430/286 |
| 4,696,885 | 9/1987 | Vijan | 430/311 |
| 5,275,658 | 1/1994 | Kimura | 118/302 |
| 5,571,560 | 11/1996 | Lin | 427/240 |
| 5,626,913 | 5/1997 | Tomoeda | 427/240 |

*Primary Examiner*—Janyce Bell
*Attorney, Agent, or Firm*—Beyer & Weaver, LLP

[57] ABSTRACT

A wafer coating apparatus for use in the application of a viscous precursor fluid on a substrate surface of a silicon substrate. The coating apparatus includes a carrier mechanism adapted to support the substrate thereon; and a coating head having a deposition surface positioned proximate and substantially parallel to the substrate surface. The deposition surface defines at least one orifice in flow communication with the precursor fluid for deposition thereof between the substrate surface and the deposition surface. The coating apparatus further includes a rotating device coupled to at least one of the coating head and the carrier mechanism for relative rotational movement between the deposition surface and the substrate surface about a rotational axis to form a thin circular film coating on the substrate surface. A method of coating a silicon substrate surface of a substrate is also provided.

32 Claims, 3 Drawing Sheets

HIGH EFFICIENCY SEMICONDUCTOR WAFER COATING APPARATUS AND METHOD

TECHNICAL FIELD

This present invention relates, generally, to film coating processes, and, more particularly, relates to high efficiency semiconductor wafer coating processes.

BACKGROUND ART

Most conventional Integrated Circuit (IC) fabrication process steps can be characterized as either "front end" steps or "back end" steps. Front end steps generally include those steps necessary to form the actual transistor elements such as source/drain regions, gates, and isolation regions. Back end steps generally include those steps necessary to create circuitry by wiring the various transistors formed by the front end processing. The integrated electronic circuitry created in the back end steps includes complex line routing patterns (or "wiring") between transistors at the integrated circuit substrate level. The wiring is provided as conductive vertical interconnects and patterned horizontal metallization layers sitting in a layered stack above the substrate. To electrically insulate the metallization layers from one another and from the semiconductor wafer or silicon substrate or dielectric layers are sequentially deposited atop a crystalline wafer or chip using separate coating techniques.

One common coating technique employs high-speed centrifugal spinning of silicon wafers to apply Spin-On Dielectrics (SODs) or resist coatings during fabrication. Resists are photosensitive films which are used to generate patterns over films when they are exposed to an appropriate light source. SOD's, on the other hand, are spin-on-dielectric films. Typically, to form about a 1 μm film on an eight (8) inch substrate, at least about three (3) to about five (5) ml of a SOD or resist fluid is sprayed, streamed or dribbled onto the substrate surface. Briefly, these fluids will heretofore be referred to as "precursor fluids" which represent the particular fluids employed as a precursor to particular film layer formation during integrated circuit fabrication. After deposition of the precursor fluid, the silicon substrate is accelerated at 10,000 to 20,000 RPM/sec and spun about a rotational axis at final speeds ranging from about 2000 rpm to about 6000 rpm. Along with a plurality of other parameters, the acceleration and spin speed during the spin cycle cooperate to apply a thin, uniformly distributed film coating on the substrate.

While this "spin coating" technology is well entrenched in the integrated chip fabrication industry as the primary method of fluid deposition, several problems are inherent with this technique. The centrifugal force imposed upon the viscous precursor fluids during the spin process in many cases cause, the loss of over ninety-nine percent (99%) of the fluid from the substrate surface. Accordingly, about 99% of the precursor fluid which is disposed of in a spin cup remains unused, and is subsequently wasted. Considering the fact that the precursor fluid cost ranges from about one dollar ($1) to about three ($3) per gram, or up to about four thousand dollars ($4000) per gallon, the amount of wasted material in this process is substantial.

Another problem associated with the prior art spin coating technology is the generation of particulates or fluid droplets which are ejected from the wafer edge during the "spiral" stage. These droplets, which travel off the wafer at high speeds, are a possible source of splashback or redeposition onto the wafer surface. Due to the abundance of precursor fluid ejected into the waste bowl during the spin cycle, costly disposal problems may occur if the fluid is environmentally unfriendly and cannot be reused. Moreover, the bowled or closed-cup spin trays enclosing the spun wafer require frequent internal washing due to impingement and coating of the internal components with the spinoff fluid therewith.

Meniscus-type coating is another coating technique commonly applied to generate resist and dielectric films on wafers. In this process, a wafer carrier mechanism is provided which includes a plate member having a plate surface adapted to support the wafer thereon. This planar plate surface defines a circular receptacle formed and dimensioned to securely seat and support the circular silicon substrate therein such that the planar substrate surface is seated flush with the planar plate surface. An elongated coating head device is provided which is oriented and adjusted just above the substrate/wafer carrier unit. To form the meniscus coating atop the substrate surface, the coating head sweeps linearly across the substrate surface and the plate surface, simultaneously depositing and distributing a meniscus coating of precursor fluid thereon.

While this technique comparatively reduces precursor fluid waste, an appreciable amount of material is still wasted due to the formation of a film on the plate surface surrounding the wafer. Such film formation on the plate surface, however, is necessary to reduce backside deposition of the fluid at the peripheral edge of the circular silicon substrate which would occur if the coating head only swept across the circular substrate surface alone. By providing a flush surface substantially juxtaposed to the peripheral edge of the seated, substrate (i.e., the plate surface of the plate member), backside deposition of fluid can be substantially reduced or eliminated.

Unfortunately, coating of the substrate surface peripheral edge and the plate surface receptacle edge occurs due to the inevitable deposition of precursor fluid in the seam therebetween. Once the meniscus coating has cured to form the resist or dielectric film layer, the substrate must be separated from the plate member. Hence, this seam must be broken during separation which causes unpredictable results such a chipping and/or delamination. Moreover, these problems may lead to particulate formation which can damage devices in subsequent process steps.

Finally, in this meniscus coating process, the film thickness is essentially determined by the meniscus thickness. These films, thus, tend to be relatively thick on the order of between about 2 μm to about 10 μm. Comparatively, the spin-coating technique typically yields films on the order of about 1 μm or less.

DISCLOSURE OF THE INVENTION

Accordingly, it is an object of the present invention to provide a wafer coating apparatus and method which more efficiently applies precursor fluids during resist or dielectric film (SOD) layer formation during integrated circuit fabrication.

Another object of the present invention is to provide a high efficiency wafer coating apparatus and method which reduces associated precursor fluid disposal problems.

Yet another object of the present invention is to provide a wafer coating apparatus and method which eliminates silicon substrate/carrier seams.

Still another object of the present invention is to provide a wafer coating apparatus and method which substantially reduces fabrication costs.

It is yet a further object of the present invention to provide a wafer coating apparatus and method which reduces chipping, delamination and particulate formation of the peripheral edge of the wafer coating.

It is a further object of the present to provide a wafer coating apparatus and method which is durable, compact, easy to maintain, has a minimum number of components and is economical to manufacture.

In accordance with the foregoing objects, the present invention provides a wafer coating apparatus for use in the application of a viscous precursor fluid on a substrate surface of a silicon substrate. The coating apparatus includes a carrier mechanism adapted to support the substrate thereon; and a coating head having a deposition surface defining a deposition orifice positioned proximate and substantially parallel to the substrate surface. The deposition orifice is in flow communication with the precursor fluid for deposition thereof between the substrate surface and the deposition surface. The coating apparatus further includes a rotating device coupled to at least one of the coating head and the carrier mechanism for relative rotational movement between the deposition surface and the substrate surface about a rotational axis. Collectively, this forms a thin circular film coating on the substrate surface.

The wafer coating apparatus of the present invention may further include a head positioning mechanism configured to align the deposition orifice relative the substrate surface. This further includes a centering device adapted to center one of a predetermined point of the coating head and a predetermined point of the substrate surface with an axis of rotation between the coating head and the substrate. Moreover, an aligning device is provided which is adapted to adjust the pitch of the deposition orifice relative to the substrate surface such that the deposition orifice is substantially parallel to the substrate surface.

In another aspect of the present invention, a method of coating a silicon substrate surface of a substrate is also provided including the steps of: aligning a deposition orifice of a deposition surface of a coating head proximate and substantially parallel to the substrate surface; and depositing a viscous precursor fluid between the deposition surface and the coating surface. The coating method further includes the step of rotating at least one of the coating head and the substrate relative one another in a manner forming a thin circular film coating on the substrate surface.

The depositing step further includes the step of passing the fluid through at least one passage in flow communication with the deposition orifice . This passage may be provided by a plurality of passages extending substantially along a longitudinal axis of the deposition orifice of the coating head. The rotating step is performed by spinning the substrate about a rotational axis substantially perpendicular to the substrate surface and the deposition surface.

The aligning step includes the step of positioning the deposition orifice about eight (8) microns to about twelve (12) microns from the substrate surface. The aligning step further includes the step of adjusting the pitch of the deposition orifice relative the substrate surface such that the deposition surface is substantially parallel to the substrate surface.

BRIEF DESCRIPTION OF THE DRAWINGS

The assembly of the present invention has other objects and features of advantage which will be more readily apparent from the following description of the best mode of carrying out the invention and the appended claims, when taken in conjunction with the accompanying drawing, in which:

BEST MODE OF CARRYING OUT THE INVENTION

Figure 1:
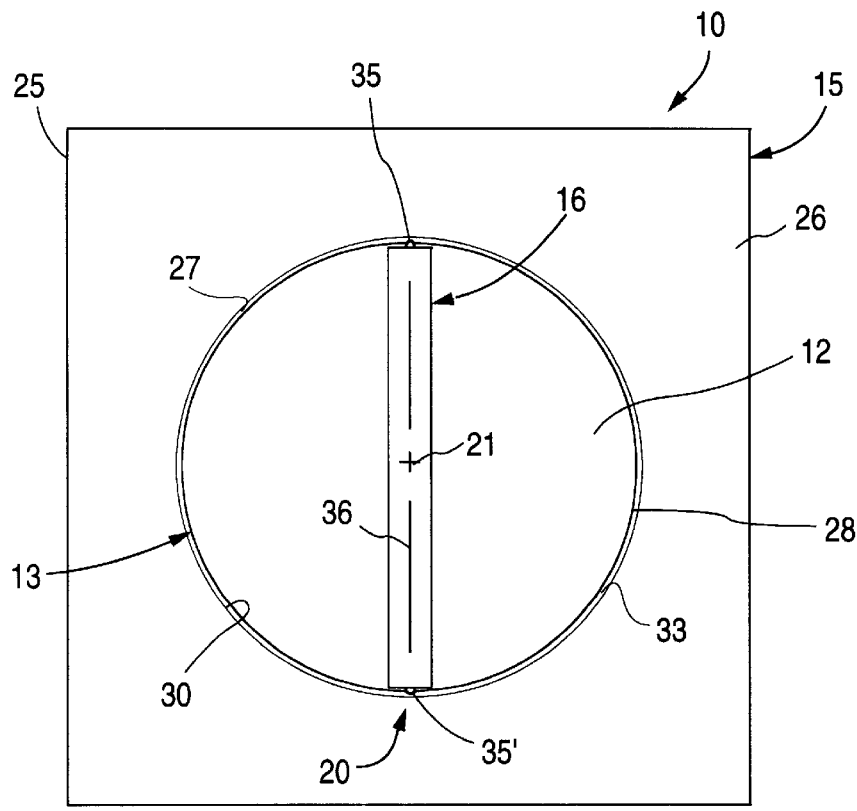
FIG. 1 is a top plan view of a wafer coating apparatus constructed in accordance with the present invention being aligned and positioned relative a circular silicon substrate.

While the present invention will be described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims. It will be noted here that for a better understanding, like components are designated by like reference numerals throughout the various figures.

Figure 4:
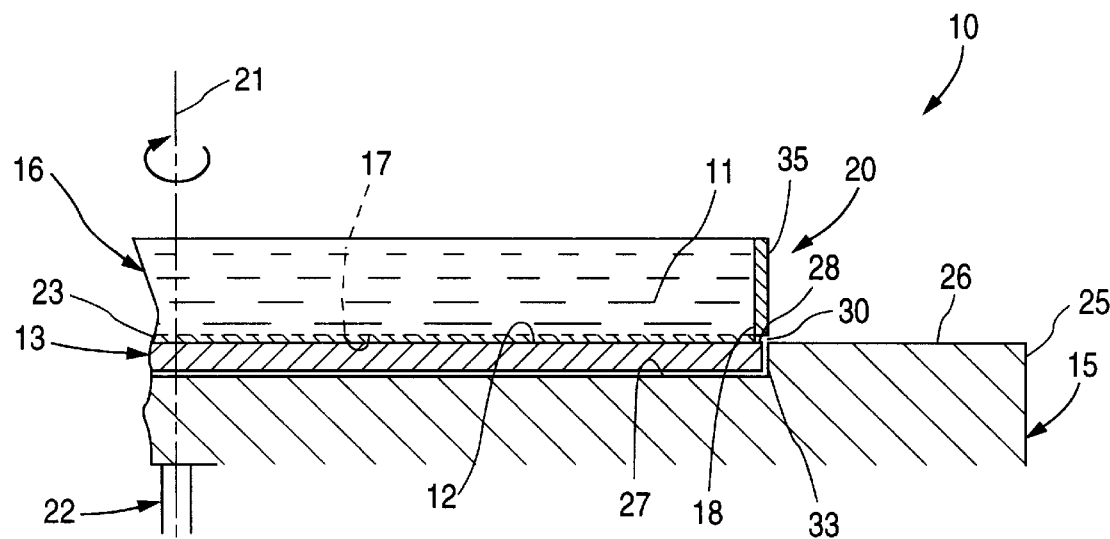
FIG. 4 is an enlarged side elevation view, in cross-section, of the coating apparatus taken substantially along the plane of the line 4—4 in FIG. 2.

Attention is now directed to FIGS. 1 and 4 where the present invention wafer coating apparatus, generally designated 10, is illustrated for use in the application of a viscous precursor fluid 11 on a substrate surface 12 of a silicon substrate 13. The wafer coating apparatus 10 includes a carrier mechanism 15 adapted to support the substrate thereon. A coating head, generally designated 16, is further provided having a bottom deposition surface 17 defining a deposition orifice 18 positioned proximate and substantially parallel to the substrate surface 12 (FIG. 4). The deposition orifice 18 is in flow communication with a precursor fluid reservoir (not shown) for deposition thereof between the substrate surface 12 and the deposition orifice 18. The coating apparatus 10 further includes a rotating device, generally designated 22, coupled to at least one of the coating head 16 and the carrier mechanism 15 for relative rotational movement between the deposition surface 17 and the substrate surface 12 about a rotational axis 21. A meniscus-type thin circular film coating 23 is thus formed atop the substrate surface 12.

Accordingly, the present invention provides a semiconductor wafer coating apparatus and method which substantially reduces waste of dielectric or photoresist coating fabrication fluids used to generate dielectric films or photoresist films on the substrate surface during integrated chip (IC) fabrication. Environmental concerns are also addressed by the application of the present invention since costly disposal of these toxic chemicals will also; be substantially reduced. The present invention further reduces problems associated with substrate peripheral edge coating and seam fracture of the layered coatings which are caused by separation of the circular silicon substrate from the carrier mechanism.

Again, "precursor fluids" will be defined as particular fluids applied which function as a precursor to specific film layer formation during integrated circuit fabrication. These fluids include photoresists and Spin-On Dielectrics (SOD) such as full organics, silicones, polyimides, polyurethanes, and fluoropolymers.

Figure 2:
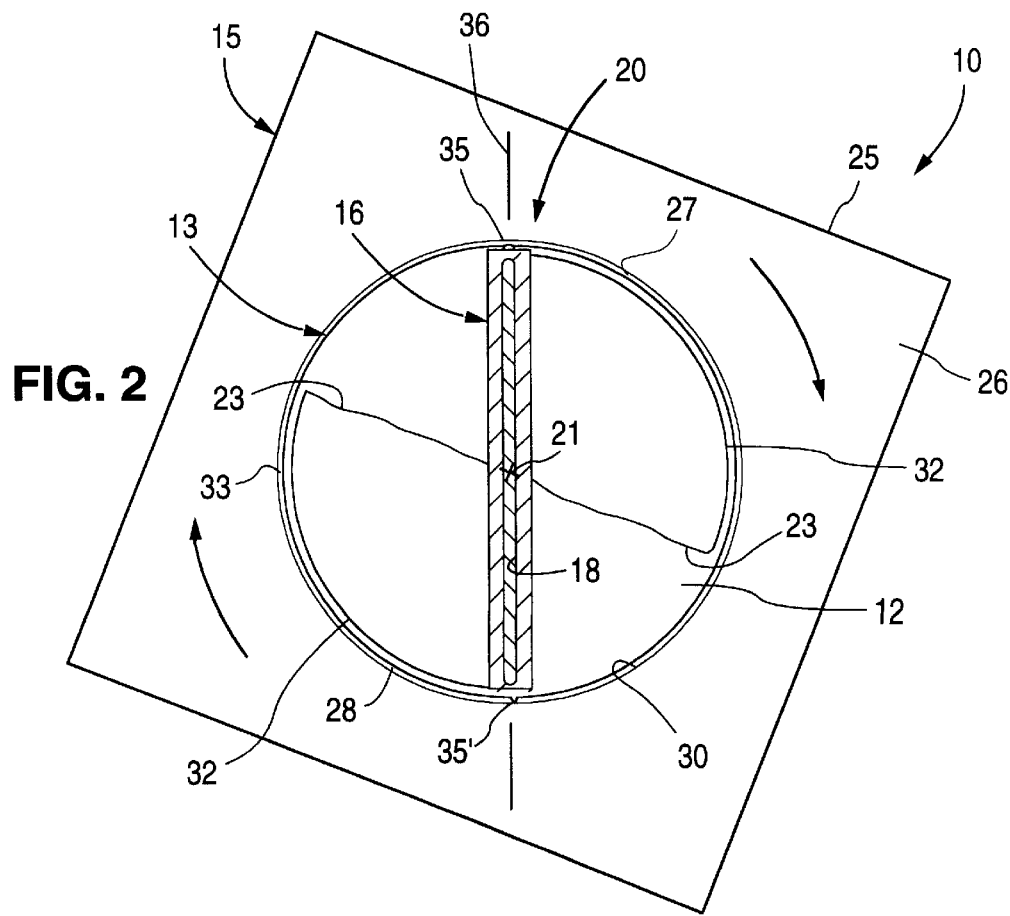
FIG. 2 is a top plan view of the wafer coating apparatus of FIG. 1 illustrating rotation of a support carrier mechanism during application of the precursor fluid onto the substrate surface to form the meniscus coating.
Figure 3:
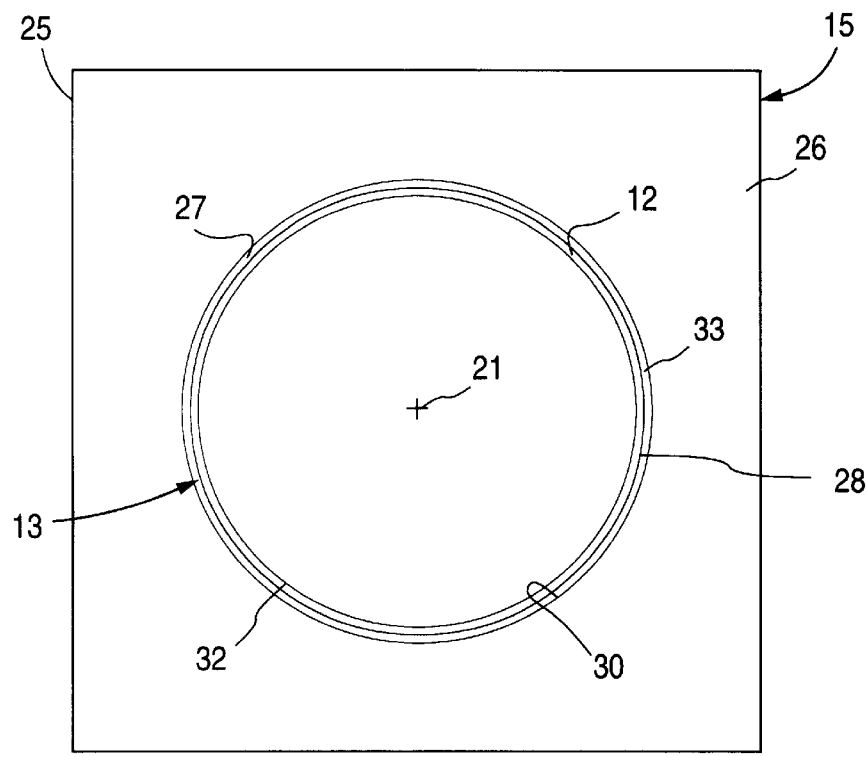
FIG. 3 is a top plan view of the support carrier mechanism and seated substrate having the circular meniscus coating applied thereon.

A conventional wafer carrier mechanism 15 can be employed, similar to those adopted in the prior art linearly-applied meniscus coating apparatus, which supportably seat the silicon substrate or semiconductor wafer 13 therein. As best viewed in FIGS. 1–3, carrier mechanism 15 includes a rectangular plate member 25 having a substantially planar plate surface 26. The peripheral shape of the plate member, however, may be provided by any functional geometry without departing from the true spirit and nature of the present invention.

Defined in the plate surface 26 of the plate member 25 is a circular receptacle 27 formed for receipt of the silicon substrate 13 therein. The wafer carrier mechanism is configured to securely orient the substrate surface 12 substantially flush with the plate surface 26 (FIG. 4), and further position the outer circumferential or peripheral edge 28 of the circular substrate 13 juxtaposed with the inner peripheral edge 30 of the plate member 25 which defines the circular receptacle 27. The circular silicon substrate 13 may be secured in the receptacle 27 and to the carrier mechanism 15 through any conventional vacuum techniques, as well as other common mechanical techniques.

As set forth above, an elongated coating head 16 is provided having a deposition orifice 18 formed in deposition surface 17 and facing the substrate surface 12 at a bottom portion of the head. When the coating head 16 is properly aligned, the deposition orifice 18 will be positioned in close proximity to the circular substrate surface during the film formation. Further, while the coating head is preferably rectangular shaped, it will be understood that the coating head may be virtually any geometry as long as the orifice 18 is properly positioned relative the silicon substrate during the film layer fabrication sequence. The coating head is preferably supported above the substrate and carrier using a conventional support structure.

A head positioning mechanism 20, as will be described in greater detail below, is provided which adjusts the relative position and alignment between the coating head 16 and the mounted silicon substrate 13. This enables uninterferred relative rotation between the coating head 16 and the substrate about rotational axis 21, during the formation of the circular meniscus coating 23. Once properly aligned, it will be appreciated that either coating head 16, the silicon substrate 13, the silicon substrate/plate member unit, or any combination thereof may be rotated about rotational axis 21. In the preferred form, rotating device 22 is operably coupled to plate member 25 for rotation thereof together with the mounted substrate 13 about rotational axis 21. Rotating device 22 may be provided by any electrical motor device (not shown) utilized in the industry which is capable of uniform, continuous rotational motion at relatively low speeds. Moreover, the motor device may be operably coupled to the plate member through any conventional mounting structure.

Referring back to FIGS. 2 and 4, coating head 16 preferably includes an elongated deposition orifice 1 having a rectangular cross-sectional dimension (FIG. 2) at the bottom deposition surface 17. This elongated slot extends from proximate one distal end of the coating head to an opposite distal end thereof, and further preferably extends from an upper end of the coating head to and terminating at the bottom deposition surface 17 (FIG. 4). Accordingly, during formation of the circular meniscus coating, the positively pressurized precursor fluid 11 flows linearly and vertically through the elongated orifice 18 in a streamlined manner for distribution onto the substrate surface as the mounted silicon substrate 13 rotates about rotational axis 21. Along with viscosity of the precursor fluid, the distance between the orifice and the substrate surface and the flow rate of the fluid, amongst others, the width of the deposition orifice is one more factor determining the shape of the meniscus. This width is preferably about 0.5 mm to about 5 mm, and most preferably about 2 mm. It will be appreciated, however, that these dimensions depend, in some degree, upon the density of the dispensed fluid.

Accordingly, a bead of deposited fluid forms between the deposition surface 17 and the substrate surface through surface tension. After deposition, a slight back pressure may be applied to the fluid to retain the bead of fluid therebetween during relative rotation.

Figure 5:
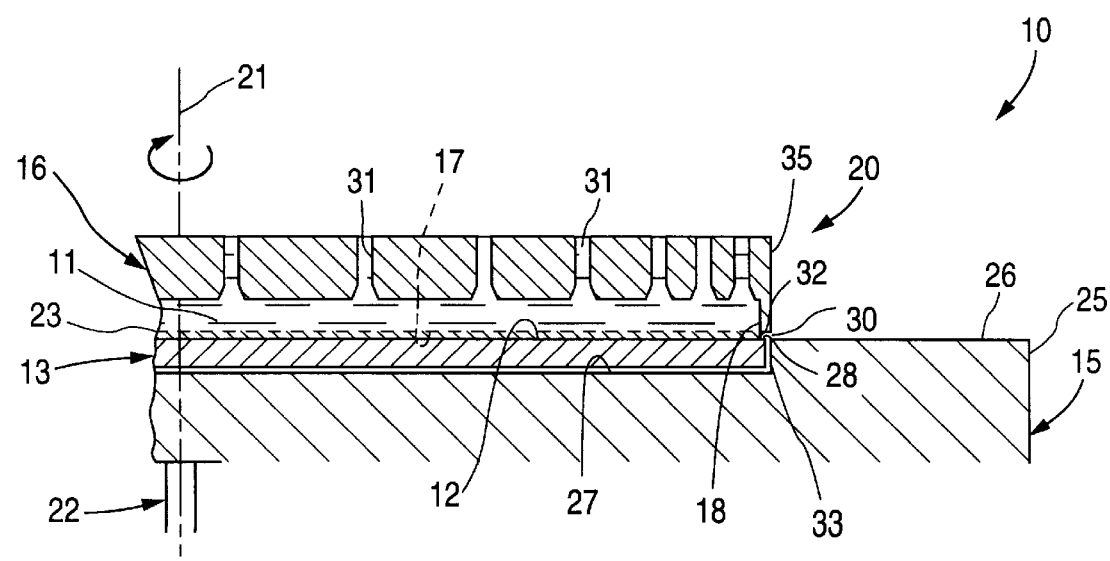
FIG. 5 is a side elevation view, in cross-section, of an alternative embodiment coating head of FIG. 4 having a plurality of passages communicating with a deposition orifice.

Alternatively, as shown in FIG. 5, a plurality of passages 31 may be provided which extend vertically through coating head 16 which communicate with elongated orifice 18 for the delivery and distribution of precursor fluid therein. In either case, the elongated orifice 18 will be in flow communication with a reservoir of precursor fluid (not shown).

Moreover, due to the circular geometry of the substrate 13, the surface area of the substrate surface to be covered by the coating head proportionally increases at distances farther away from the center point of the circular substrate. Accordingly, to compensate for this continual increase in area, the flow rate of the precursor fluid may be proportionally increased as well. As shown in FIG. 5, this increase may be provided by a larger density of passages 31 communicating with the deposition orifice 18 at distances farther away from the rotational axis 21. Another method of increasing the flow rate may be to provide larger diameter passages at distances farther away from the center point of the circular substrate.

FIG. 4 best illustrates that when the coating head 16 is properly aligned with the substrate surface, the opposed distal ends of the elongated orifice 18 will extend in close proximity to, but not vertically over and beyond, the peripheral edge 28 of the substrate. Accordingly, the length dimension of the elongated deposition orifice 18 is substantially equal to, although slightly less than, the diameter of circular silicon substrate 13. Thus, during relative rotation of the silicon substrate about rotational axis 21, the outer peripheral edge 32 of the deposited circular meniscus coating 23 will be substantially equal to, although slightly less than, the diameter of circular silicon substrate 13. This slight length discrepancy or "gap" enables deposition of the precursor fluid onto the substrate surface without depositing fluid into the seam 33 formed between the substrate peripheral edge 28 and the receptacle peripheral edge 30. Undesirable coating of the substrate peripheral edge 28 by the precursor fluid will thus be substantially eliminated, as well as the damage caused by seam fracture of the cured meniscus coating during substrate separation. No need for seam 33 if this art is practiced. Moreover, costly precursor fluid is not wasted coating the plate surface 26 of plate member 25.

In the preferred embodiment, the "gap" between the distal end of the elongated orifice and the peripheral edge 28 of the circular substrate 13 is about 1 mm to about 3 mm. More preferably, this "gap" is about 1 mm. It will be appreciated, however, that the determination of this dimension is a function of many factors including the precision of the alignment, the viscosity of the precursor fluid and the desired thickness of the meniscus coating.

After mounting of the circular silicon substrate 13 to the carrier mechanism 15, alignment of the coating head with the mounted substrate or carrier mechanism 15 is critical and imperative to the proper rotational operation of the wafer coating apparatus 10. As set forth above, a head positioning mechanism 20 is provided which is configured to align the deposition orifice 18 of coating head 16 relative to the substrate surface 12 of silicon substrate 13. The head positioning mechanism 20 includes a centering device which cooperates with the carrier mechanism 15 to center the deposition orifice 18 of the coating head 16 (i.e., a center point of the deposition orifice extending along a longitudinal axis 36) with the rotational axis 21 about which plate member 25 rotates. Since the plate member 25 of carrier mechanism 15 is preferably operably coupled to rotating device 22, upon mounting of circular substrate 13 to the carrier mechanism, the rotational axis 21 of the wafer coating apparatus 10 will be aligned to extend perpendicularly through the center of the circular substrate surface 12.

In the preferred embodiment, to center the coating head 16 relative the substrate 13, the head positioning mechanism aligns the coating head 16 to position the rotational axis 21 perpendicularly through a center point of the deposition orifice. Accordingly, during formation of the circular meniscus coating 23 where the plate member 25 rotates about rotational axis 21, the "gap" between the opposed distal ends of orifice 18 and the peripheral edge 28 of circular substrate 13 can be substantially maintained.

The head positioning mechanism 20 of the present invention further includes an alignment device adapted to adjust the tilt or pitch of the deposition orifice 18 relative the substrate surface 12 which may be caused by the vacuum chuck or the like which secures the circular substrate to the carrier mechanism. To provide a uniform thickness coating across the substrate surface, the deposition orifice 18 and the deposition surface 17 are to be aligned substantially parallel to substrate surface 12 of the substrate. This pitch adjustment is preferably performed by calculating and adjusting the vertical distance between the deposition orifice 18 and the substrate surface to be substantially equivalent at two or more spaced-apart locations along the deposition surface. Accordingly, as best viewed in FIG. 4, the head positioning mechanism 20 includes two sensing devices 35, 35' which are preferably located at the opposed distal ends of coating head 16, and which cooperate to adjust the centered deposition orifice substantially parallel to the substrate surface. In the preferred form, these sensing devices 35, 35' are provided by conventional optical sensors such as those manufactured by Luxtron, Inc.

After measurement of the distance between the respective distal end of the deposition orifice and the substrate surface, each sensor generates a signal representative of the measured distance which the head positioning mechanism uses to further adjust the position of the coating head. Moreover, the alignment device can be employed to adjust the relative distance between the deposition orifice and the substrate surface to control the thickness of the meniscus coating which may be as thick as a few hundred microns. In the preferred embodiment, the thickness of the circular meniscus coating is about eight (8) microns to about twelve (12) microns, and most preferably about ten (10) microns.

While the substrate surface 12 of circular substrate 13 and the deposition orifice are substantially planar, it will be appreciated that the substrate surface and the deposition orifice may be non-planar and even curvilinear in some instances.

Once the head positioning mechanism 20 has properly aligned the coating head 16 relative the substrate surface 12, the rotating device 22 of wafer coating apparatus 10 can commence relative rotation between the deposition orifice 18 and the substrate surface. This rotation is preferably uniform and relatively slow, depending upon the rate of flow of the fluid from the deposition orifice, having a speed of between about ten (10) rpm to about forty (40) rpm. Most preferably, the speed of rotation is about twenty (20) rpm.

In the embodiment of FIGS. 1–4, the angle or degree of relative rotation is preferably at least 180° (about ½ revolution) to generate a complete circular meniscus and assure proper coverage of substrate surface 12. It will be understood that the degree of relative rotation will depend upon a number of factors including the relative rate of rotation, thickness of the desired meniscus, the flow rate of the precursor fluid from the orifice, as well as the type of precursor fluid itself.

Subsequent to the formation of the circular meniscus coating, the circular substrate may be spun using a conventional bowl or closed-cup spin tray. Such a spin coat will only be necessary should it be desirable to thin the meniscus coating with a minimal loss of fluid compared to the prior art. Employing this technique, the edge bead formed at the edge of the substrate would require removal. Solvent, thus, could be sprayed at the edge to dissolve the bead. Moreover, at higher rates of high-speed centrifugal spinning rotation, in some instances, the formation of a complete circular meniscus by the coating head may not be necessary to ultimately cover the substrate surface.

Figure 6:
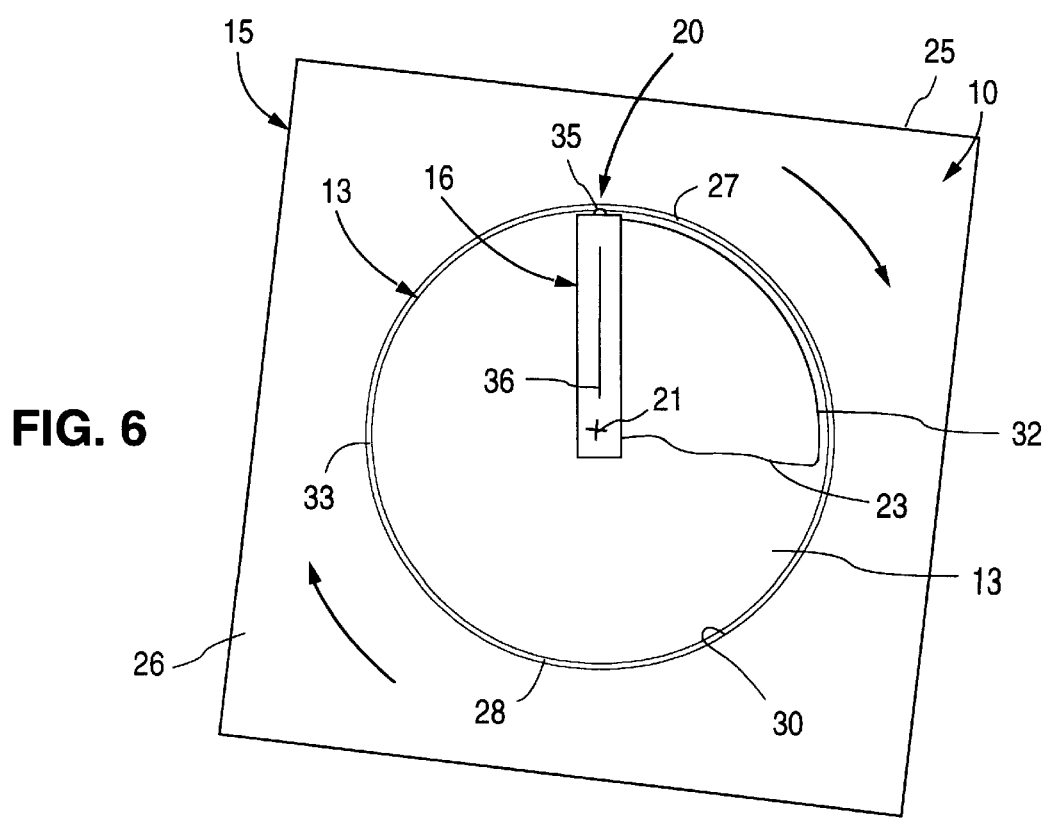
FIG. 6 is a top plan view of an alternative embodiment wafer coating apparatus.

Turning now to FIG. 6, an alternative embodiment of the present invention is illustrated including an elongated coating head 16 having a length substantially shorter than the diameter of the circular silicon substrate. In this embodiment, the relative rotational axis 21 will be off-set from the center point of the deposition orifice. The head positioning mechanism, hence will only center one distal end in close proximity to, but not vertically over and beyond, the peripheral edge 28 of the substrate, while the opposite end is centered with the center of the circular silicon substrate. Accordingly, the length dimension of orifice 18 is substantially less than the diameter of the circular silicon substrate 13. In this embodiment, the degree of relative rotation must be by at least 360° to generate a circular meniscus on substrate surface 12.

Another variation to the present invention, although not illustrated, would be to provide a coating head having more than two finger portions extending radially from the center point thereof. For example, the coating head may include four finger portions each spaced about 90° apart. In this embodiment, the degree of relative rotation must be by at least 90° to generate a circular meniscus on substrate surface 12.

In another aspect of the present invention, a method of coating a substrate surface 12 of a substrate 13 is also provided including the steps of: aligning a deposition orifice 18 of a coating head proximate and substantially parallel to the substrate surface 12; and depositing a viscous precursor fluid 11 between the deposition orifice 18 and the plate surface 26. The coating method further includes the step of rotating at least one of the coating head 16 and the substrate 13 relative one another in a manner forming a thin circular film coating 23 on the substrate surface 12.

The depositing step further includes the step of passing the precursor fluid 11 through at least one deposition orifice 18 in flow communication with the deposition surface 17. The rotating step is performed by spinning the substrate 13 about a rotational axis 21 substantially perpendicular to the substrate surface 12 and the deposition surface 17.

The aligning step includes the step of positioning the deposition surface 17 about eight (8) microns to about twelve (12) microns from the substrate surface. The aligning step further includes the step of centering a predetermined point of the coating head 16 with a predetermined point of the substrate surface 12. The centering step is performed by centering one of the predetermined point of the coating head 16 and the predetermined point of the substrate surface with an axis of rotation between the coating head 16 and the substrate 13.

After the rotating step, the method of the present invention includes the step of spinning the substrate 13 at a high rpm of 2000 rpm to about 6000 rpm removing the edge bead if desired. The coating method further includes the step of curing the film coating.

What is claimed is:

1. A method of coating a substrate surface of a silicon substrate comprising the steps of:
   optically aligning a deposition orifices, defined in a deposition surface of a coating heads proximate and substantially parallel to the substrate surface with an optical head positioning mechanism;
   depositing a viscous precursor fluid between the deposition orifice and the coating surface; and
   rotating at least one of the coating head and the substrate relative to one another in a manner forming a thin circular film coating on said substrate surface.

2. The method according to claim 1 wherein,
   said depositing step includes the step of passing said fluid through at least one passage in flow communication with said deposition orifice.

3. The method according to claim 2 wherein,
   said orifice is provided by an elongated orifice.

4. The method according to claim 2 wherein,
   said deposition surface is elongated and positioned opposite and adjacent to said substrate surface.

5. The method according to claim 4 wherein,
   said orifice is elongated and extends substantially along a longitudinal axis of said deposition surface of the coating head.

6. The method according to claim 4 wherein,
   said passing step includes the step of passing said fluid through a plurality of passages in flow communication with said deposition orifice, and extending substantially along a longitudinal axis of said deposition orifice of the coating head.

7. The method according to claim 4 wherein,
   said substrate surface is substantially planar.

8. The method according to claim 1 wherein,
   said rotating step is performed by spinning said substrate about a rotational axis substantially perpendicular to said substrate surface and said deposition orifice.

9. The method according to claim 8 wherein,
   said substrate rotates about said rotational axis between about 10 rpm to about 40 rpm.

10. The method according to claim 9 wherein,
    said substrate rotates about said rotational axis at about 20 rpm.

11. The method according to claim 9 wherein,
    said substrate is a silicon wafer.

12. The method according to claim 11 wherein,
    said wafer is supportably secured on a carrier mechanism.

13. The method according to claim 11 wherein,
    said precursor fluid is provided by a Spin-On Dielectric.

14. The method according to claim 11 wherein,
    said precursor fluid is provided by a photoresist fluid.

15. The method according to claim 1 wherein,
    said aligning step includes the step of positioning said deposition orifice about eight (8) microns to about twelve (12) microns from the substrate surface.

16. The method according to claim 15 wherein,
    said aligning step includes the step of positioning said deposition orifice about ten (10) microns from the substrate surface.

17. The method according to claim 1 wherein,
    said aligning step includes the step of centering a predetermined point of said coating head with a predetermined point of said substrate surface.

18. The method according to claim 17 wherein,
    said centering step is performed by centering one of the predetermined point of said coating head and the predetermined point of said substrate surface with an axis of rotation between the coating head and the substrate.

19. The method according to claim 18 wherein,
    said aligning step includes the step of positioning said deposition orifice about eight (8) microns to about twelve (12) microns from the substrate surface.

20. The method according to claim 19 wherein,
    said aligning step includes the step of positioning said deposition orifice about ten (10) microns from the substrate surface.

21. The method according to claim 18 wherein,
    said substrate surface and said deposition orifice are substantially planar, and
    said aligning step further includes the step of adjusting the pitch of the deposition orifice relative said substrate surface such that said deposition orifice is substantially parallel to said substrate surface.

22. The method according to claim 1 further including the step of:
    after said rotating step, spinning said substrate at a high rpm.

23. The method according to claim 22 wherein,
    said high rpm is about 2000 rpm to about 6000 rpm.

24. The method according to claim 1 further including the step of:
    curing said film coating.

25. A wafer coating apparatus for use in the application of a viscous precursor fluid on a substrate surface of a silicon substrate comprising:
    a carrier mechanism adapted to support the substrate thereon;
    a coating head having a deposition surface defining a deposition orifice positioned proximate and substantially parallel to the substrate surface, said deposition orifice in flow communication with the precursor fluid for deposition thereof between the substrate surface and the deposition surface;
    a optical head positioning mechanism configured to align said deposition orifice relative said substrate surface; and
    a rotating device coupled to at least one of said coating head and said carrier mechanism for relative rotational movement between said deposition surface and the substrate surface about a rotational axis to form a thin circular film coating on said substrate surface.

26. The wafer coating apparatus as defined in claim 25 wherein, said head positioning mechanism further includes an aligning device adapted to adjust the pitch of the deposition orifice relative said substrate surface such that said deposition orifice is substantially parallel to said substrate surface.

27. The wafer coating apparatus as defined in claim 25 wherein, said deposition orifice is elongated and extends substantially horizontally from one distal end to an opposite distal end thereof.

28. The wafer coating apparatus as defined in claim 27 wherein, said orifice is provided by an elongated orifice extending substantially along a longitudinal axis of said deposition surface proximate the one distal end to proximate an opposite distal end thereof.

29. The wafer coating apparatus as defined in claim 27 wherein, said coating head includes a plurality of passages in flow communication with said deposition orifice, and extending substantially along a longitudinal axis of said deposition orifice.

30. The wafer coating apparatus as defined in claim 25 wherein, said rotating, device is operably coupled to said carrier such that said substrate rotates about a rotational axis substantially perpendicular to said substrate surface and said deposition orifice.

31. The wafer coating apparatus as defined in claim 25 wherein, said head positioning mechanism includes a centering device adapted to center one of a predetermined point of said coating head and a predetermined point of said substrate surface with an axis of rotation between the coating head and the substrate.

32. The wafer coating apparatus as defined in claim 31 wherein, said head positioning mechanism further includes an aligning device adapted to adjust the pitch of the deposition orifice relative said substrate surface such that said deposition orifice is substantially parallel to said substrate surface.

* * * * *